United States Patent
Lee et al.

(10) Patent No.: US 7,633,109 B2
(45) Date of Patent: Dec. 15, 2009

(54) DRAM STRUCTURE AND METHOD OF MAKING THE SAME

(75) Inventors: Tzung-Han Lee, Taipei (TW);
Chih-Hao Cheng, Taipei County (TW);
Te-Yin Chen, Taoyuan County (TW);
Chung-Yuan Lee, Tao-Yuan (TW);
En-Jui Li, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 117 days.

(21) Appl. No.: 11/965,769

(22) Filed: Dec. 28, 2007

(65) Prior Publication Data
US 2009/0008691 A1   Jan. 8, 2009

(30) Foreign Application Priority Data
Jul. 2, 2007   (TW) ............................... 96123978 A

(51) Int. Cl.
*H01L 27/108*   (2006.01)
*H01L 29/76*   (2006.01)

(52) U.S. Cl. ........................ 257/300; 257/301; 257/330; 438/259

(58) Field of Classification Search ......... 257/300–301, 257/330–332, E29.256, E29.261; 438/259
See application file for complete search history.

(56) References Cited

U.S. PATENT DOCUMENTS 7,304,342 B2 *  12/2007  Nirschl et al. ................ 257/301
2004/0248364 A1 *  12/2004  Hsiao et al. .................. 438/243

\* cited by examiner

*Primary Examiner*—Theresa T Doan
(74) *Attorney, Agent, or Firm*—Winston Hsu

(57) ABSTRACT

A DRAM structure has a substrate, a buried transistor with a fin structure, a trench capacitor, and a surface strap on the surface of the substrate. The surface strap is used to electrically connect a drain region to the trench capacitor.

6 Claims, 25 Drawing Sheets

DRAM STRUCTURE AND METHOD OF MAKING THE SAME

BACKGROUND OF THE INVENTION

1. Field of the Invention

The present invention relates to a DRAM structure and a method of making the same, and more particularly to a DRAM structure that uses a conducting strap to connect a MOS transistor with a trench capacitor. An SSBL (single-sided buried strap) is replaced by the conducting strap. In this way, resistance can be reduced and current leakage can be decreased.

2. Description of the Prior Art

Electrical products are becoming lighter, thinner, shorter, and smaller, and dynamic random access memories (DRAMs) are being scaled down to match the trends of high integration and high density. A DRAM comprising many memory cells is one of the most popular volatile memory devices utilized today. Each memory cell comprises a MOS transistor and at least a capacitor, wherein the MOS transistor and the capacitor form a series connection with each other. By using a word line and a bit line, a DRAM can be read and programmed.

FIG. 1 shows a prior art DRAM structure. The conventional DRAM structure includes a MOS transistor 200 and a trench capacitor 202, wherein the MOS transistor comprises a gate conductor 204, a oxide layer 206, a source doping region 208, a drain doping region 210, and the trench capacitor 202 comprises a conductive layer 210, a bottom electrode 212, a dielectric layer 214, a cap layer 216, and a single-sided buried strap (SSBS) 218. In addition, bias can be formed between the source doping region 208 and the drain doping region 210 by using the word line 220 and bit line 222. The current or electronic charge will flow from the source doping region 208 into the trench capacitor 202 by passing the drain doping region 210 and the SSBS 218, and will then be stored in the trench capacitor 202.

The size of a modern SSBS 218 is decreased because the size of modern DRAMs has also decreased. The resistance, however, has increased due to the shrinking size of the SSBS.

Furthermore, in the conventional DRAM structure, a high electronic field will occur around the junction of the SSBS 21 8, thereby decreasing the operating effect, and causing current leakage and control problems.

SUMMARY OF THE INVENTION

Therefore, in order to solve the abovementioned problems, a DRAM structure and a method of making the DRAM structure are provided in the present invention.

According to the claimed invention, the DRAM structure comprises: a substrate; a trench capacitor formed in the substrate, wherein the trench capacitor has a top surface being coplanar with a top surface of the substrate; a buried gate formed in the substrate, wherein the buried gate has a top surface being coplanar with the top surface of the substrate; a drain region formed between the trench capacitor and the buried gate in the substrate; and a conducting strap formed on a portion of the top surface of the substrate to electrically connect the trench capacitor to the drain region.

According to the claimed invention, the method of making the DRAM structure comprises providing a substrate comprising a first STI structure and a trench capacitor, wherein the trench capacitor comprises a first conductive layer and a capacitor dielectric layer surrounding the first conductive layer in order to isolate the first conductive layer and the substrate; forming a first oxide layer on the surface of the first conductive layer; forming a buried gate at a side of the trench capacitor; forming a drain doping region in the substrate between the buried gate and the trench capacitor and forming a source doping region in the substrate at a side of the buried gate; removing the first oxide layer; and forming a conducting strap and a contact pad simultaneously, wherein the conducting strap covers the drain doping region, the first conductive layer and part of the cap layer, and wherein the contact pad covers the source doping region.

The DRAM structure provided in the present invention has a buried word line. Unlike the conventional word line, the buried word line is buried in the substrate rather than being positioned on the surface of the substrate. Therefore, the integration of elements can be increased. In addition, the fin structure can increase the contact area between the control gate and the substrate, so problems of the drain induced barrier lowering (DIBL) effect and the short channel effect can be reduced. Furthermore, the current leakage can be prevented by the conducting strap provided in the present invention. In this way, the DRAM structure can reach a smaller size.

These and other objectives of the present invention will no doubt become obvious to those of ordinary skill in the art after reading the following detailed description of the preferred embodiment that is illustrated in the various figures and drawings.

DETAILED DESCRIPTION

FIG. 2 to FIG. 11 depict a method of making the DRAM structure according to the first embodiment of the present invention.

Figure 1:
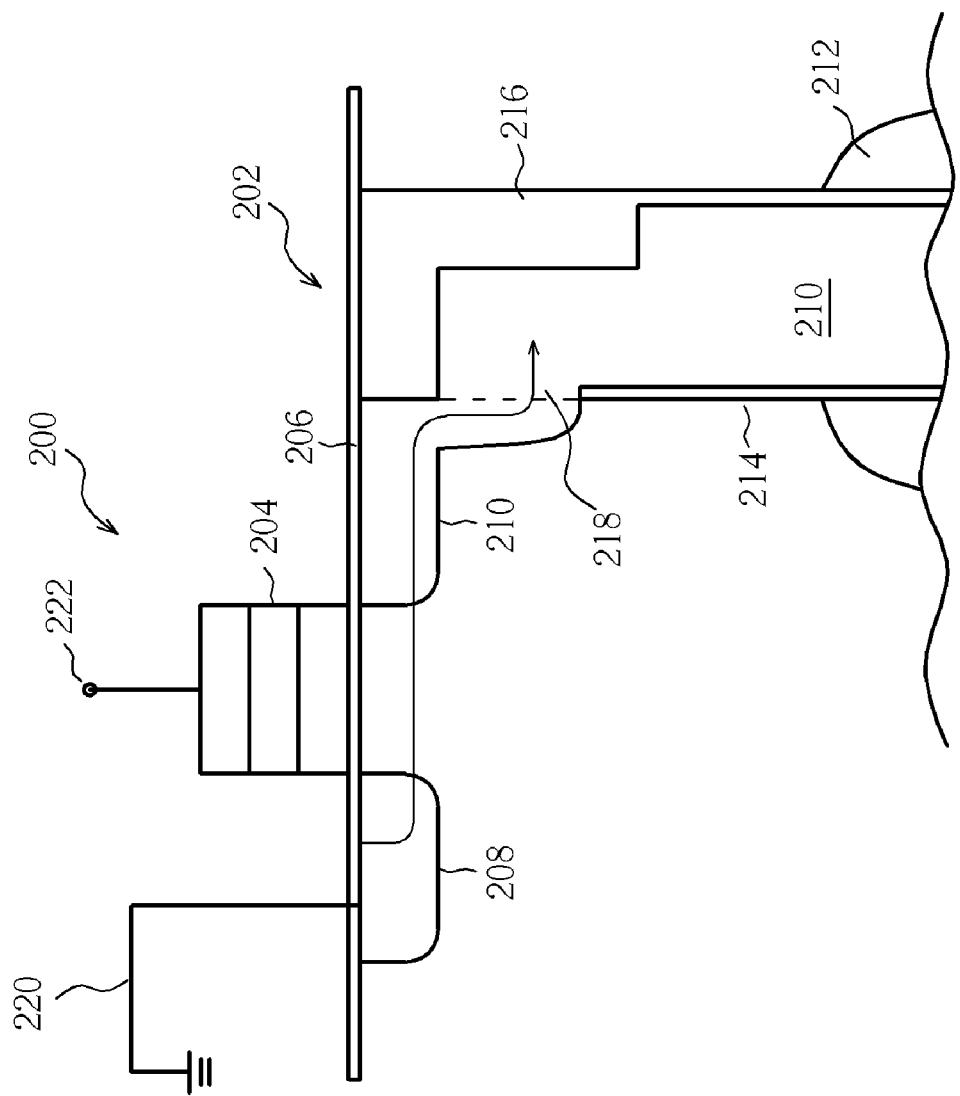
FIG. 1 depicts a prior art DRAM structure.
Figure 2:
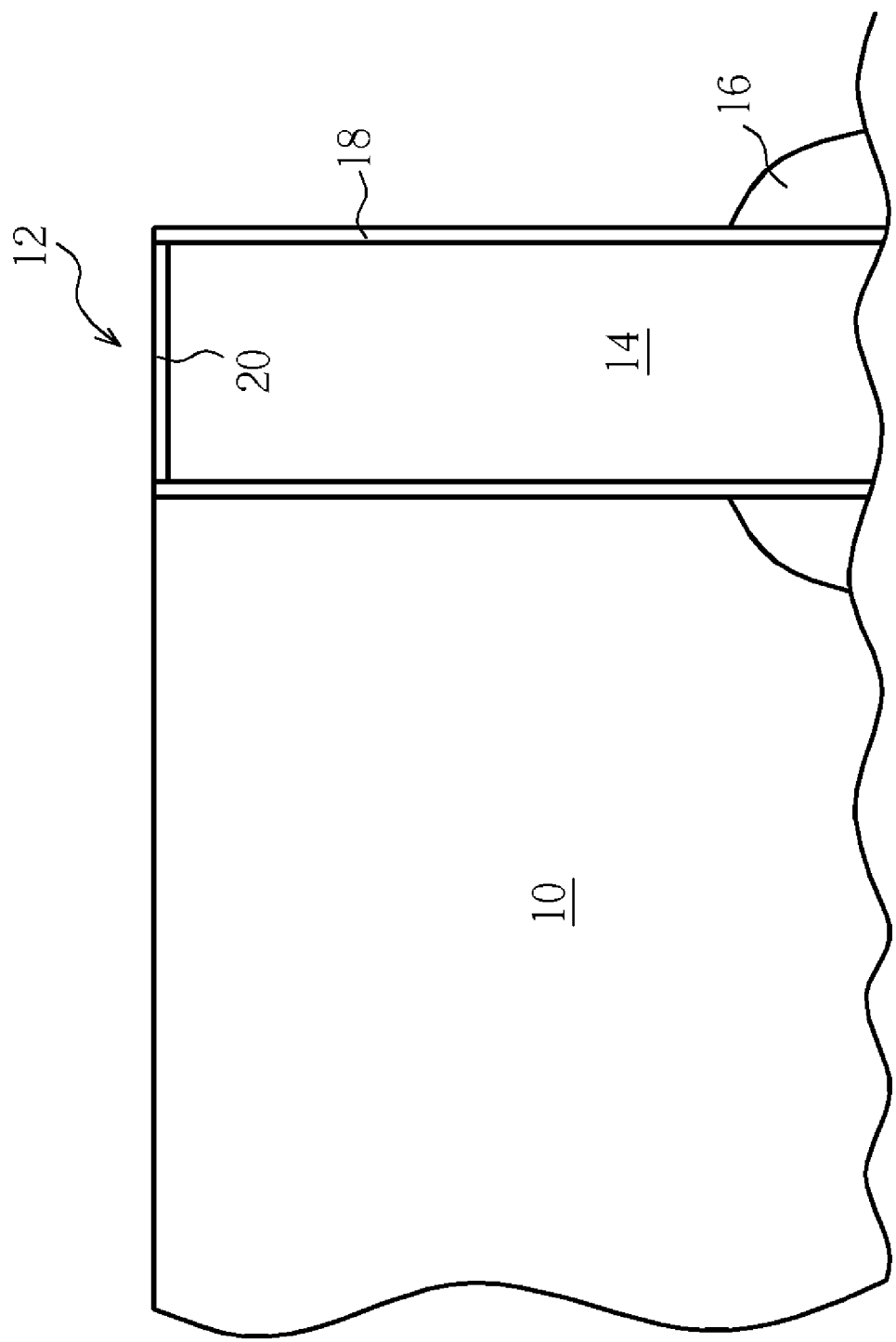
FIG. 2 to FIG. 11 depict a method of making the DRAM structure according to a first embodiment of the present invention.

As shown in FIG. 2, a substrate 10 comprising a first STI structure (not shown) and a trench capacitor 12 is provided. The trench capacitor 12 comprises a conductive layer 14, a bottom electrode 16, and a capacitor dielectric layer 18 surrounding the conductive layer 14 in order to isolate the conductive layer 14 and the substrate 10. A oxide layer 20 is formed on the surface of the conductive layer 14. In the preferred embodiment, the oxide layer 20 is formed coplanar with the substrate 10 surface. The conductive layer 14 can be polysilicon or any conductive materials.

Figure 3:
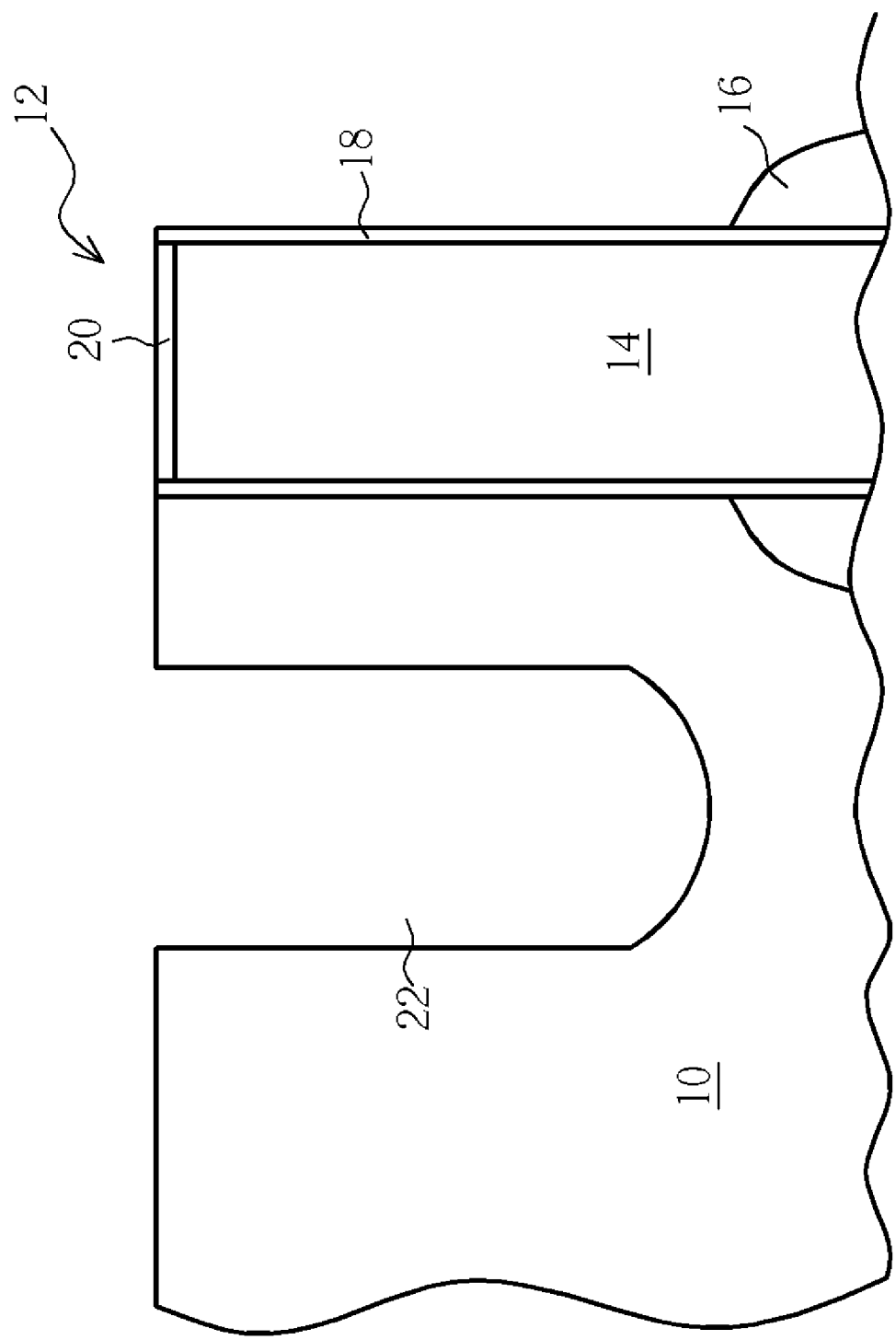
Figure 4:
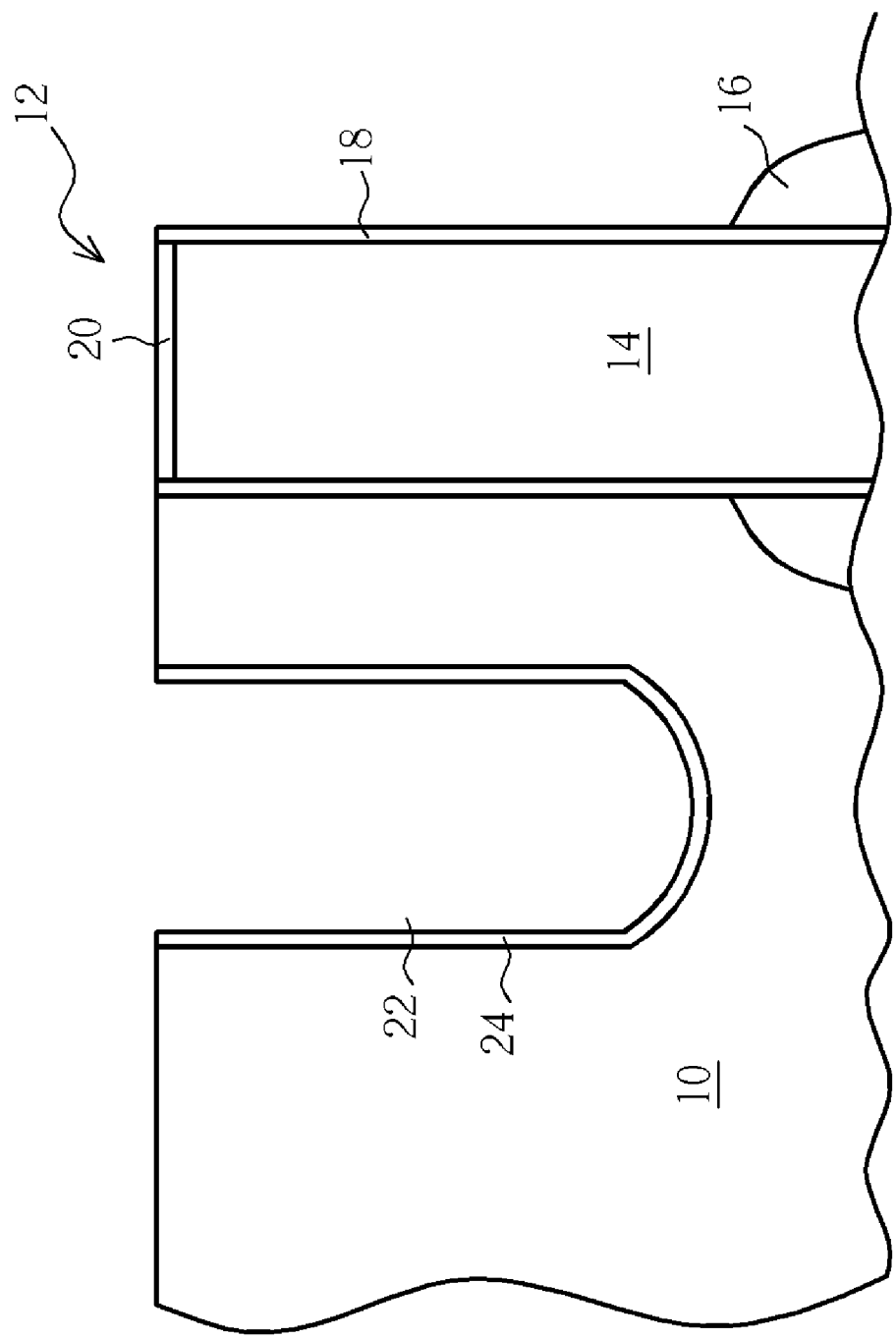
Figure 5:
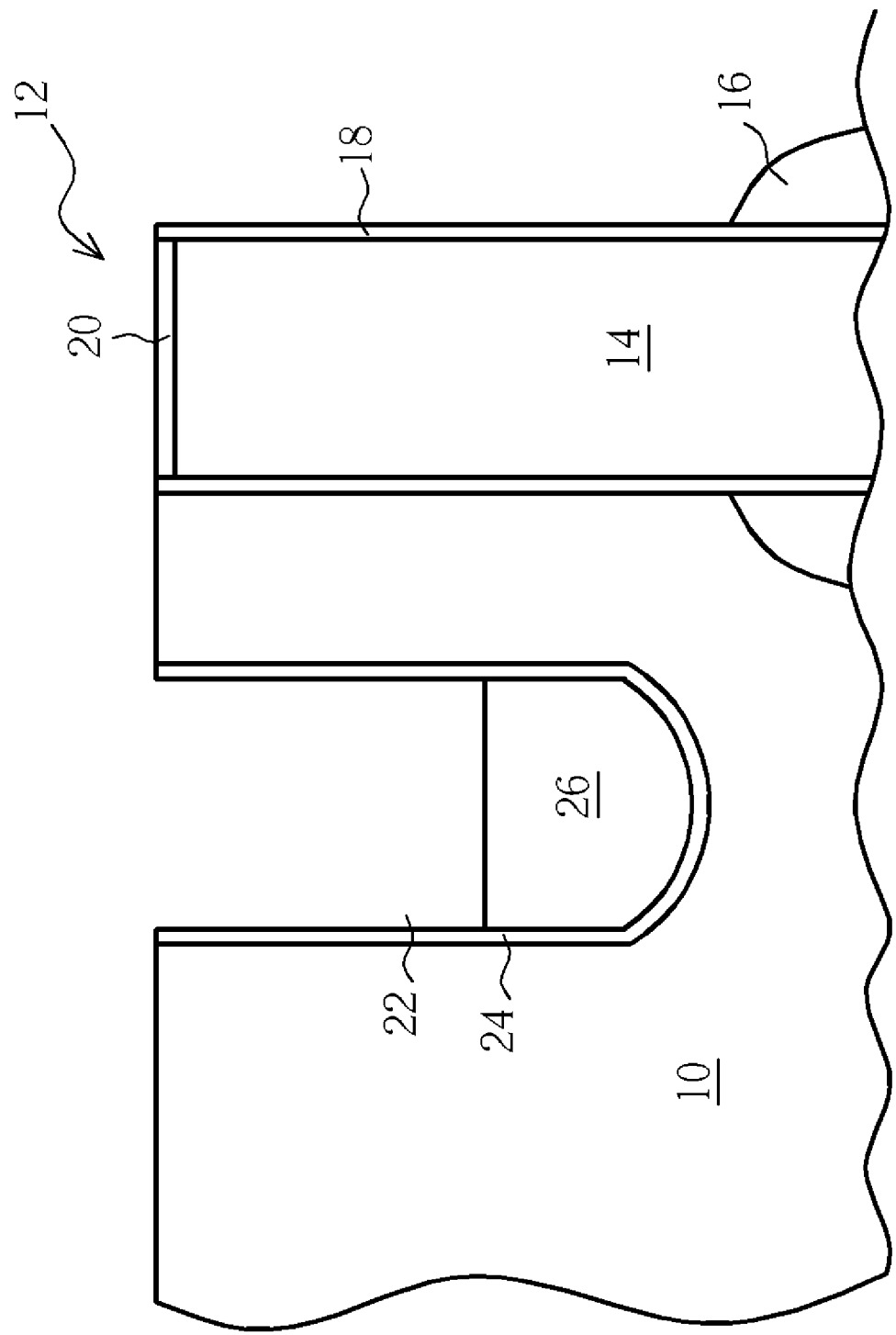

As shown in FIG. 3, a trench 22 is formed in the substrate 10 and at a side of the trench capacitor 12. As shown in FIG. 4, a oxide layer 24 is formed on the surface of the trench 22 by a thermal or deposition process. The oxide layer serves 24 as an insulation layer. As shown in FIG. 5, a gate matter 26 is formed on the oxide layer 24 and fills up the trench 22. Then, the gate matter 26 is etched back to a predetermined depth. The gate matter 26 can be polysilicon or any conductive materials.

Figure 6:
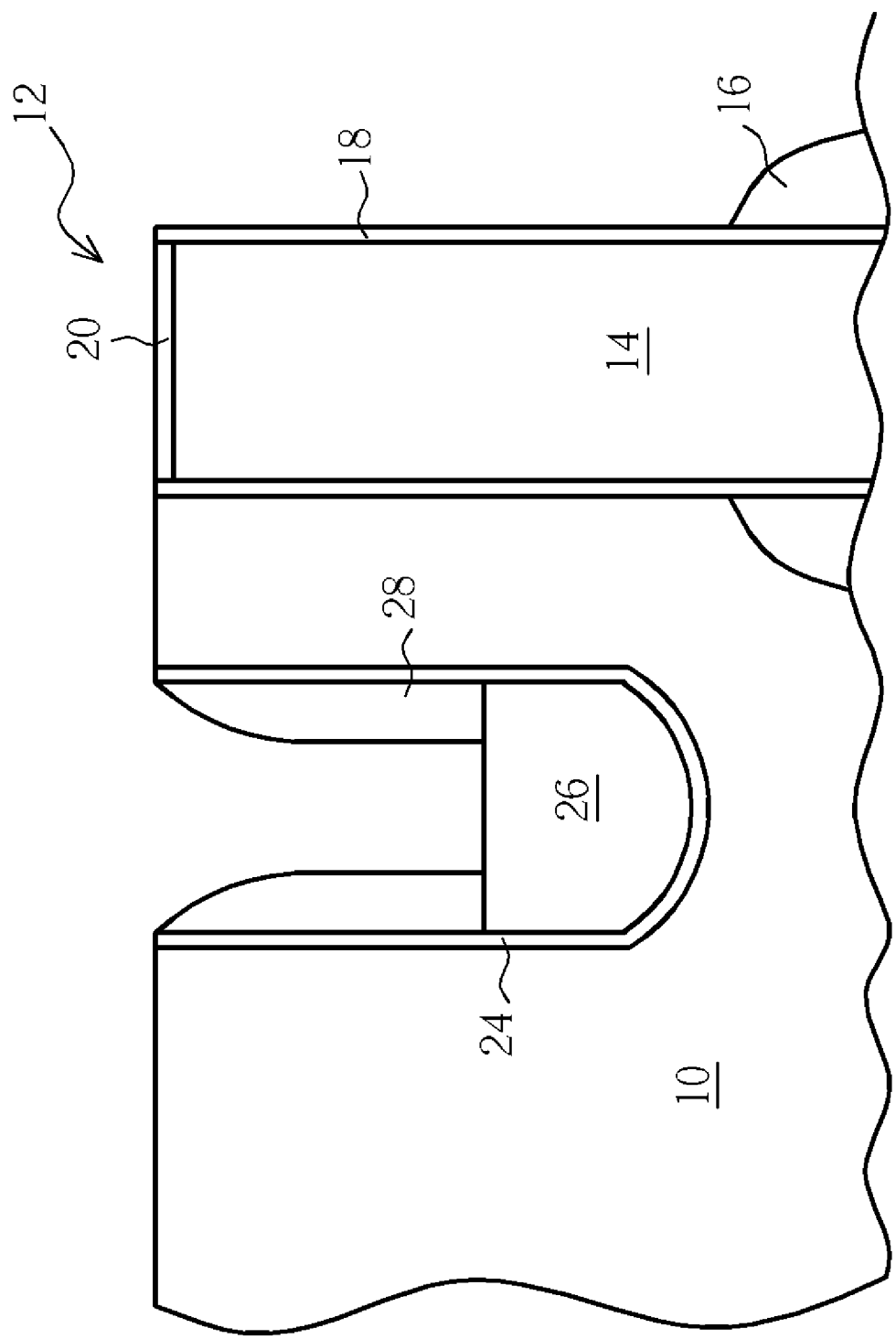

As shown in FIG. 6, an inner spacer 28 is formed on the gate matter 26 and on a vertical surface of the oxide layer 22. The method of forming the inner spacer 28 includes depositing a silicon oxide layer on the inside wall of the trench 22 and on the surface of the gate matter 26, then performing an anisotropic etching on the silicon oxide layer.

Figure 7:
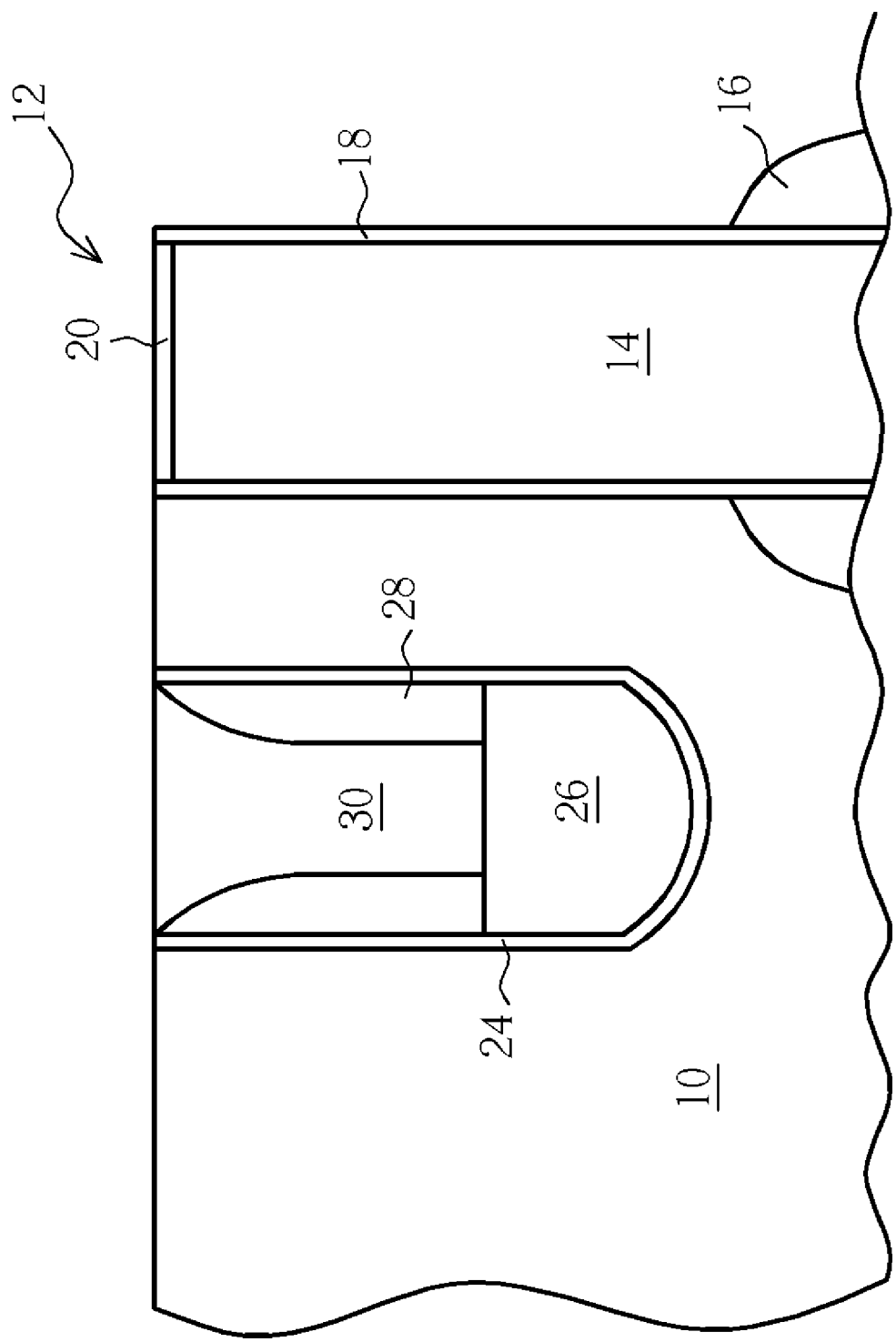

As shown in FIG. 7, a conductor 30 is formed on the gate matter 26 and fills up the trench 22, wherein the conductor 30 can be W, Ni, Cu, silicide, polysilicon or any combination thereof and wherein the conductor 30 serves as a buried word line.

Figure 8:
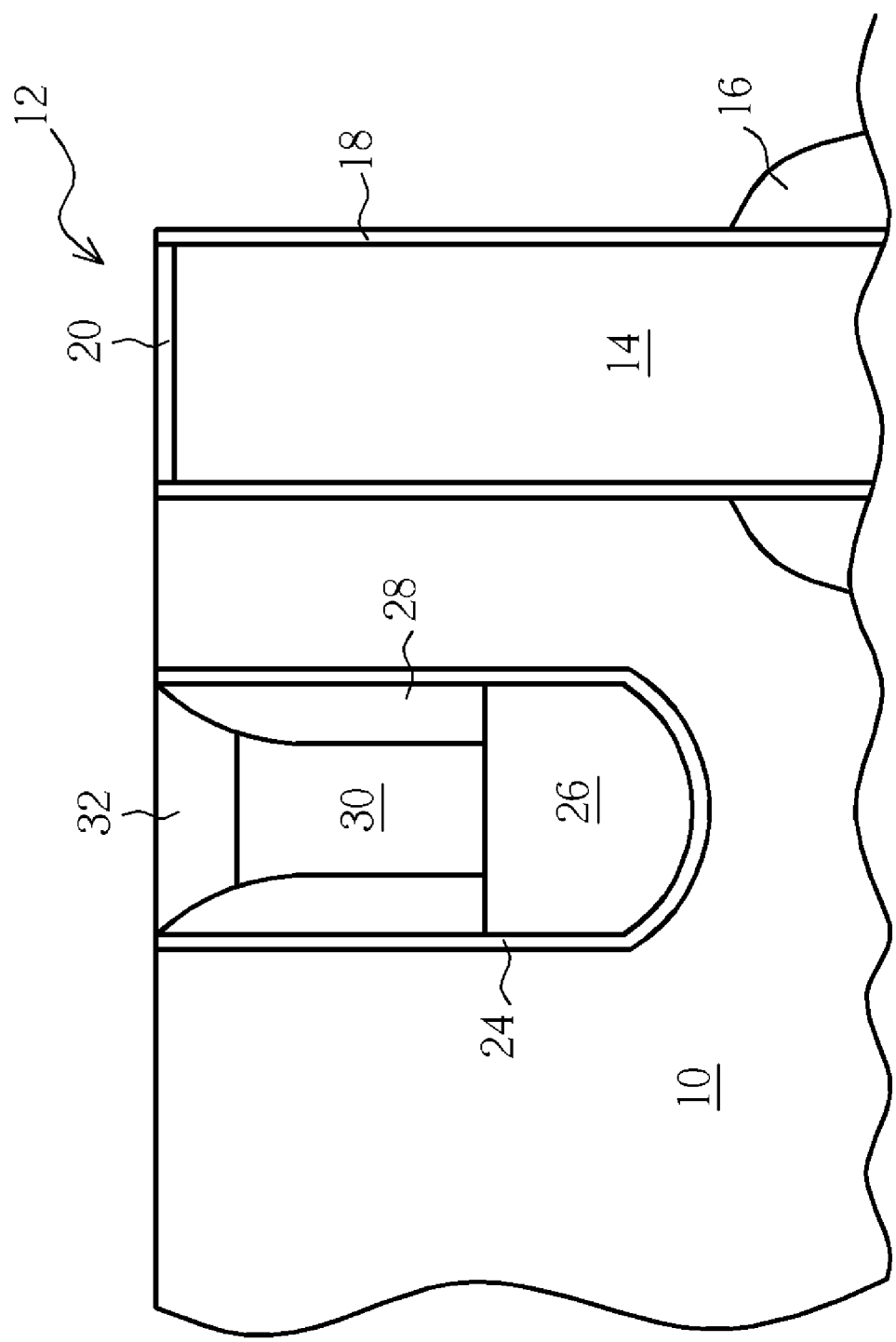

As shown in FIG. 8, the conductor 30 is etched to a certain depth. Then, a cap layer 32 is formed on the conductor 30, wherein the cap layer 32 can be silicon oxide, silicon nitride, silicon oxide/silicon nitride, silicon nitride/silicon oxide, or silicon oxide/silicon nitride/silicon oxide. In the preferred embodiment, the cap layer 32 is formed coplanar with the substrate 10 surface. The cap layer 32 and the inner spacer 28 form an inverted U shape to isolate the conductor 30. The conductor 30 together with the gate matter 26, the oxide layer 24, the cap layer 32 and the inner spacer 28 function as a buried gate.

Figure 9:
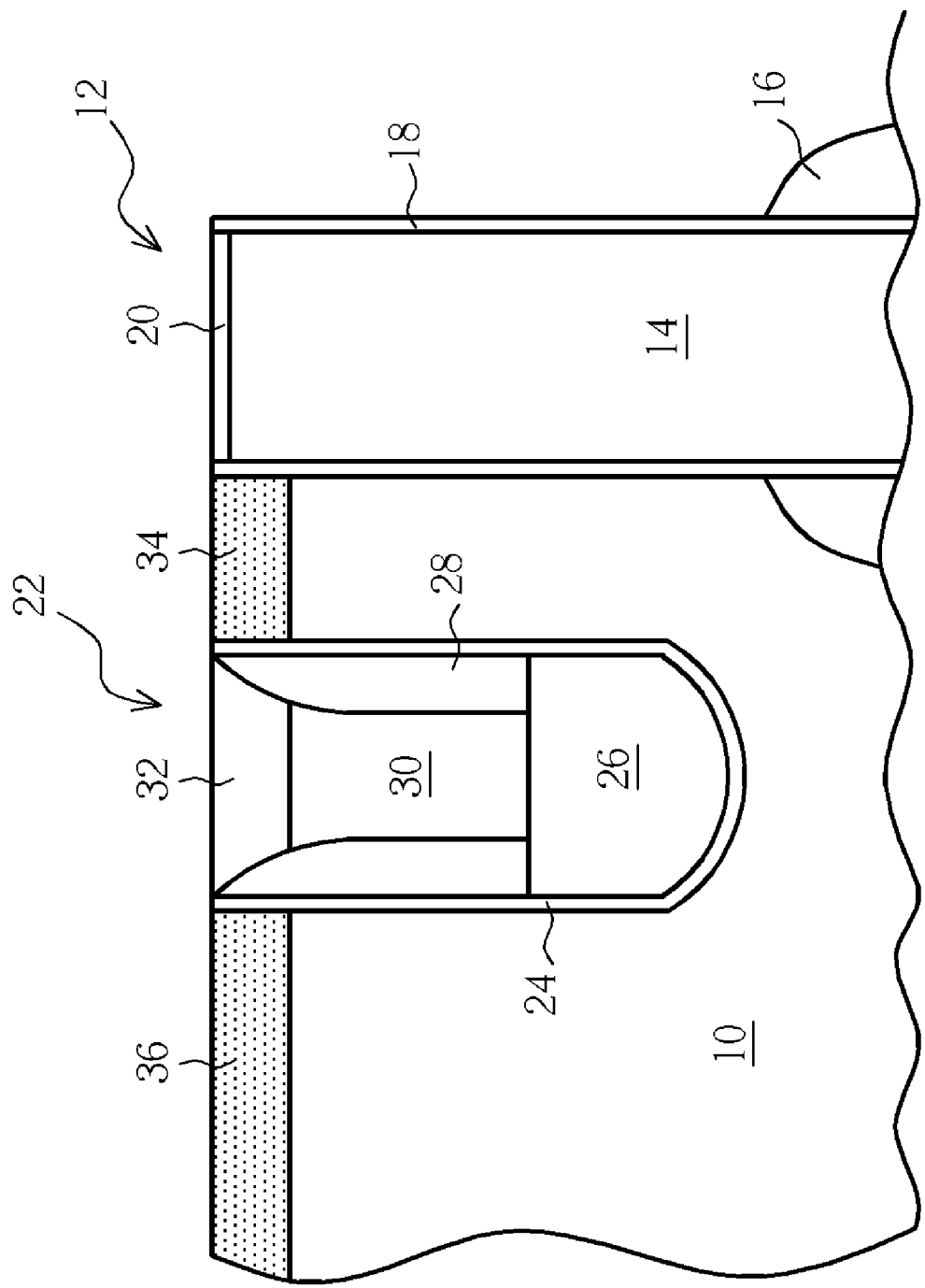

As shown in FIG. 9, by an ion implantation process, a drain doping region 34 is formed in the substrate 10 between the trench 22 and the trench capacitor 12 and a source doping region 36 is formed in the substrate 10 and on an opposite side to the drain region of the buried gate.

Figure 10:
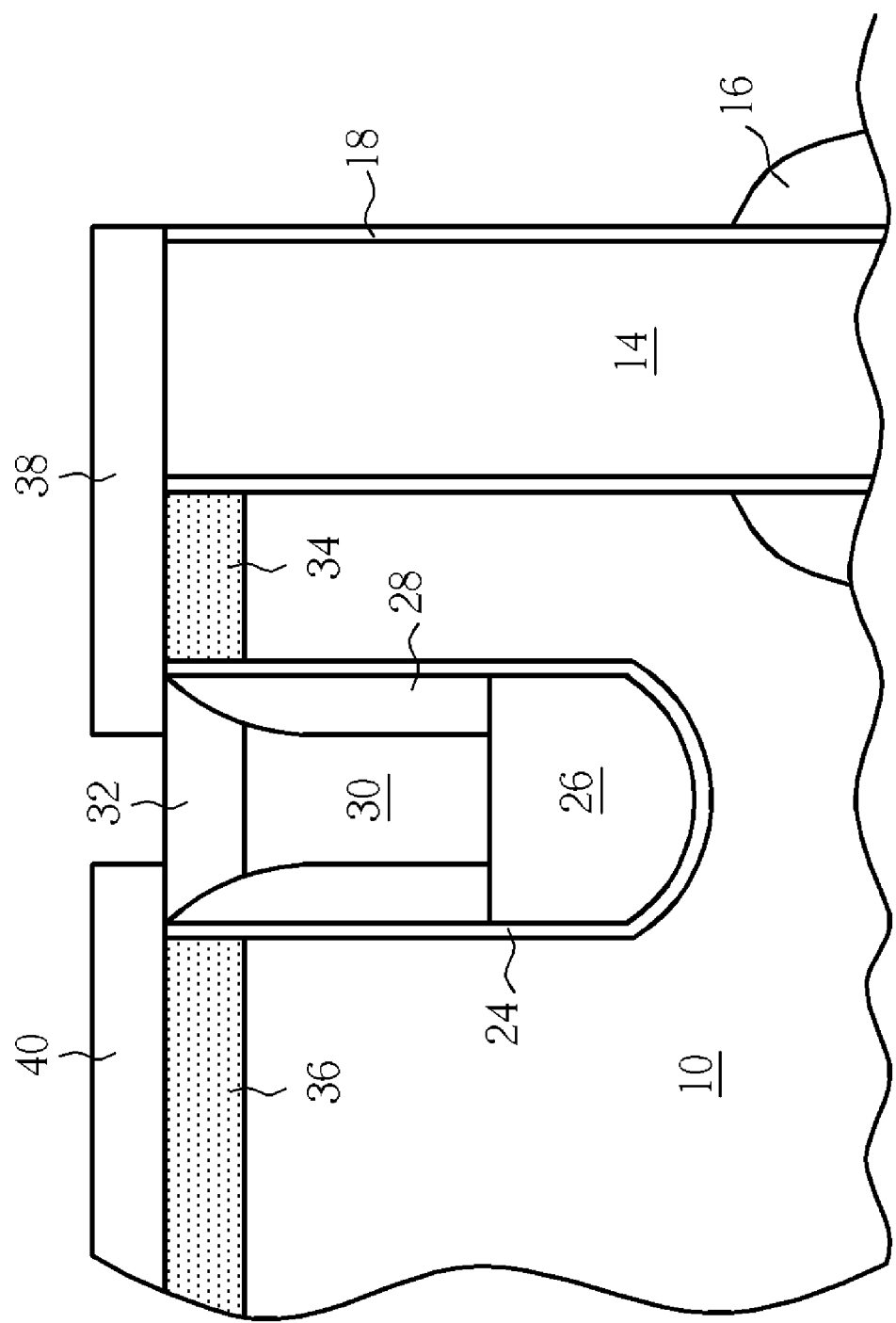

As shown in FIG. 10, the oxide layer 20 on the trench capacitor 12 is removed. Next, a conducting strap 38 and a contact pad 40 are formed simultaneously, wherein the conducting strap 38 covers the drain doping region 34, the conductive layer 14 and part of the cap layer 32. The contact pad 40 covers the source doping region 36. The conducting strap 38 can be metal, silicide, non-metal (such as graphite and polysilicon) or any combination thereof. In addition, the method of forming the conducting strap 38 includes chemical vapor deposition (CVD) and plasma enhanced chemical vapor deposition (PECVD). The thickness of the conducting strap is about 3 metal atoms or 500 Å.

Figure 11:
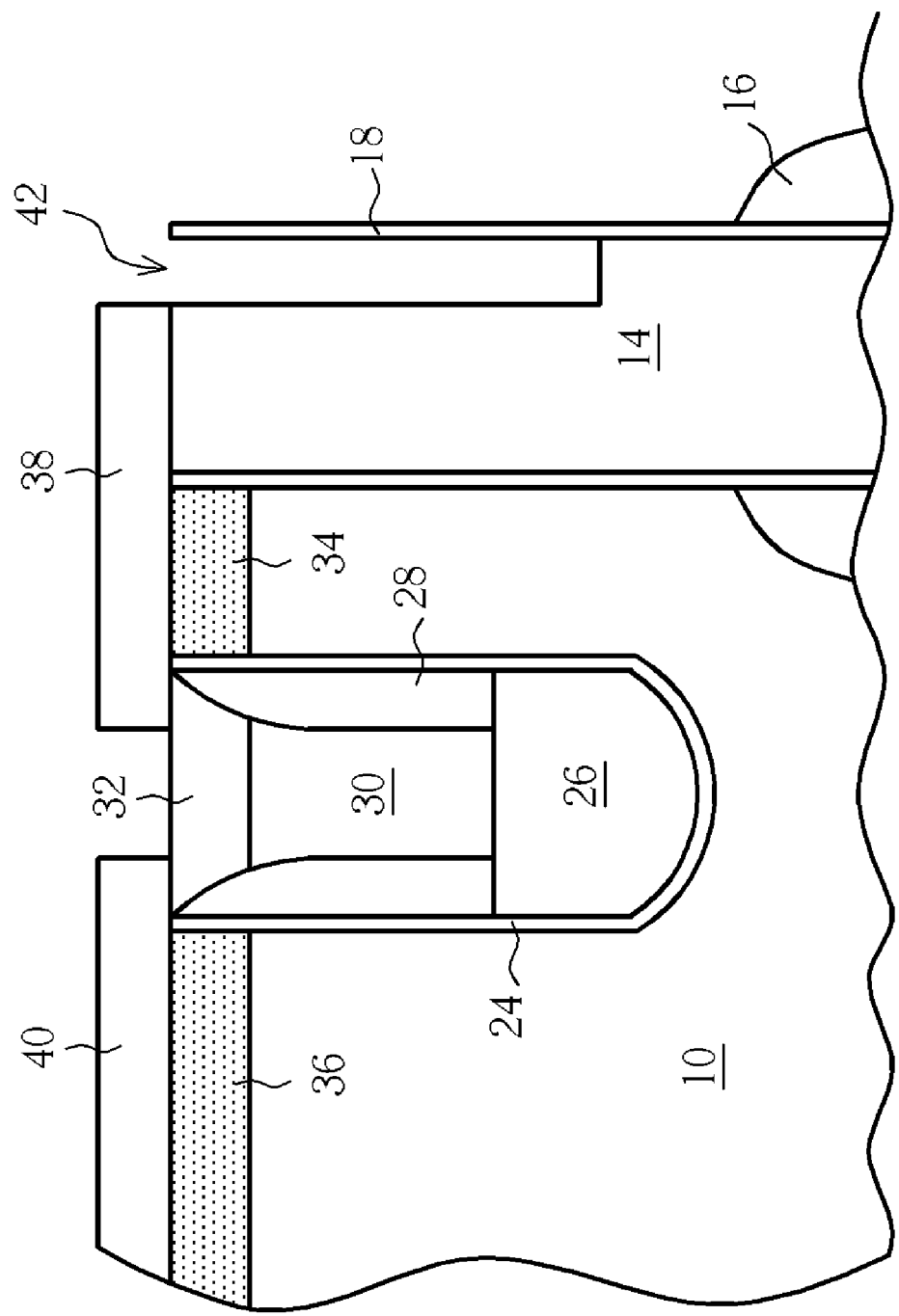

As shown in FIG. 11, a lithography process and etching process is performed to etch the conducting strap 38 and the conductive layer 14 partly to form an isolation structure 42. Then an insulating material is filled into the isolation structure 42. This step completes the formation of the DRAM structure provided in the present invention.

Figure 12:
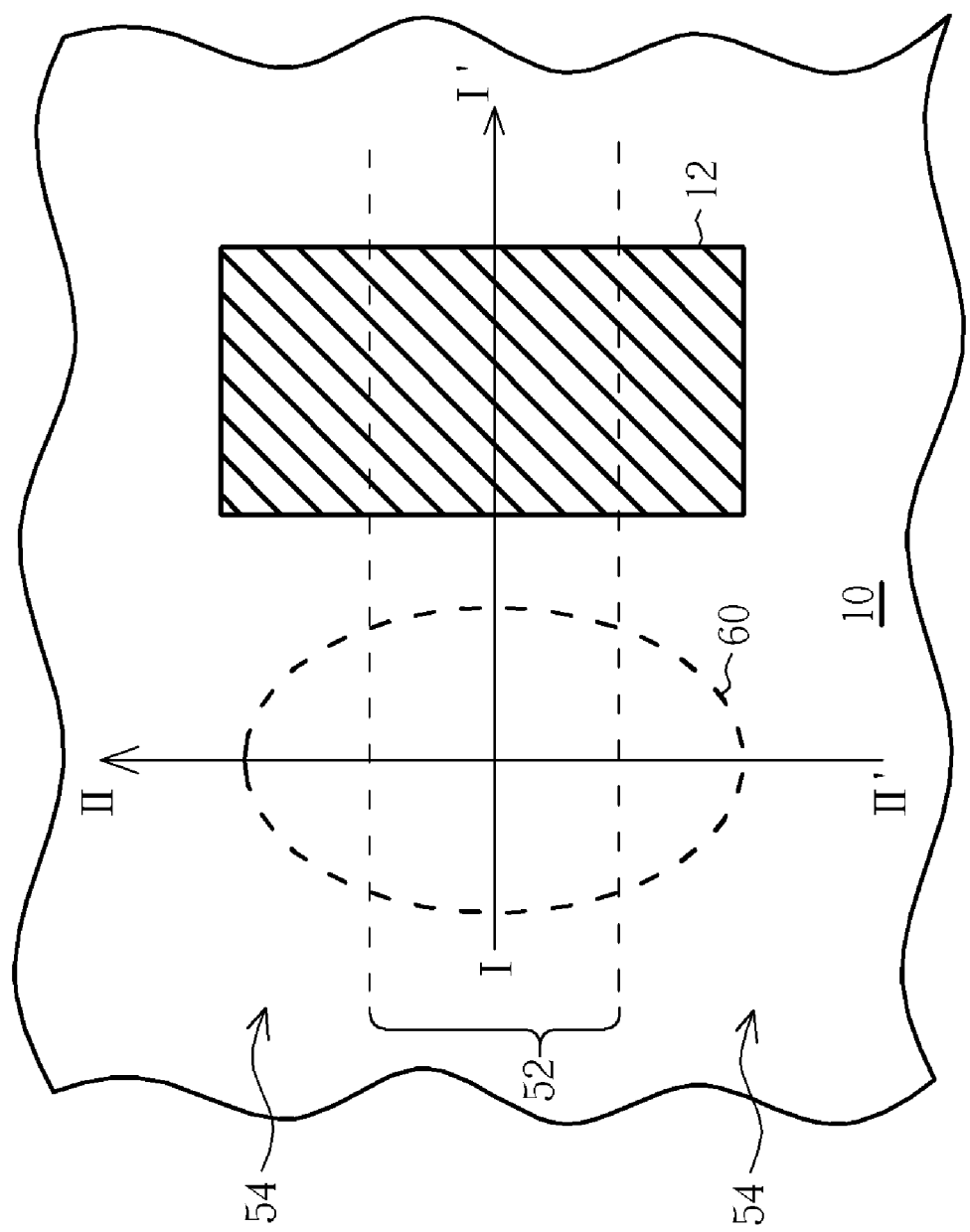
FIG. 12 depicts a top view of the DRAM structure according to a second embodiment of the present invention.

FIG. 12 shows a top view of the DRAM structure according to the second embodiment of the present invention. FIG. 13 to FIG. 22 show a method of making the DRAM structure according to the second embodiment of the present invention. FIG. 12 shows a substrate 10 comprising an active area 52, an STI structure 54 positioned at two sides of the active area 52, a trench capacitor 12, and a region 60 which will form a buried gate, wherein the active area 52 can be a semi-conductive material, such as Si, Ge, C—Si, silicon on insulator (SOI), Si—Ge on insulator, compound semiconductor, multilayer semiconductor or any combination thereof and wherein the first STI structure 54 can be silicon oxide, silicon nitride, or silicon oxide/silicon nitride.

FIG. 13 to FIG. 22 show a sectional view of making the DRAM structure taken along line I-I' and line II-II' in FIG. 12.

Figure 13:
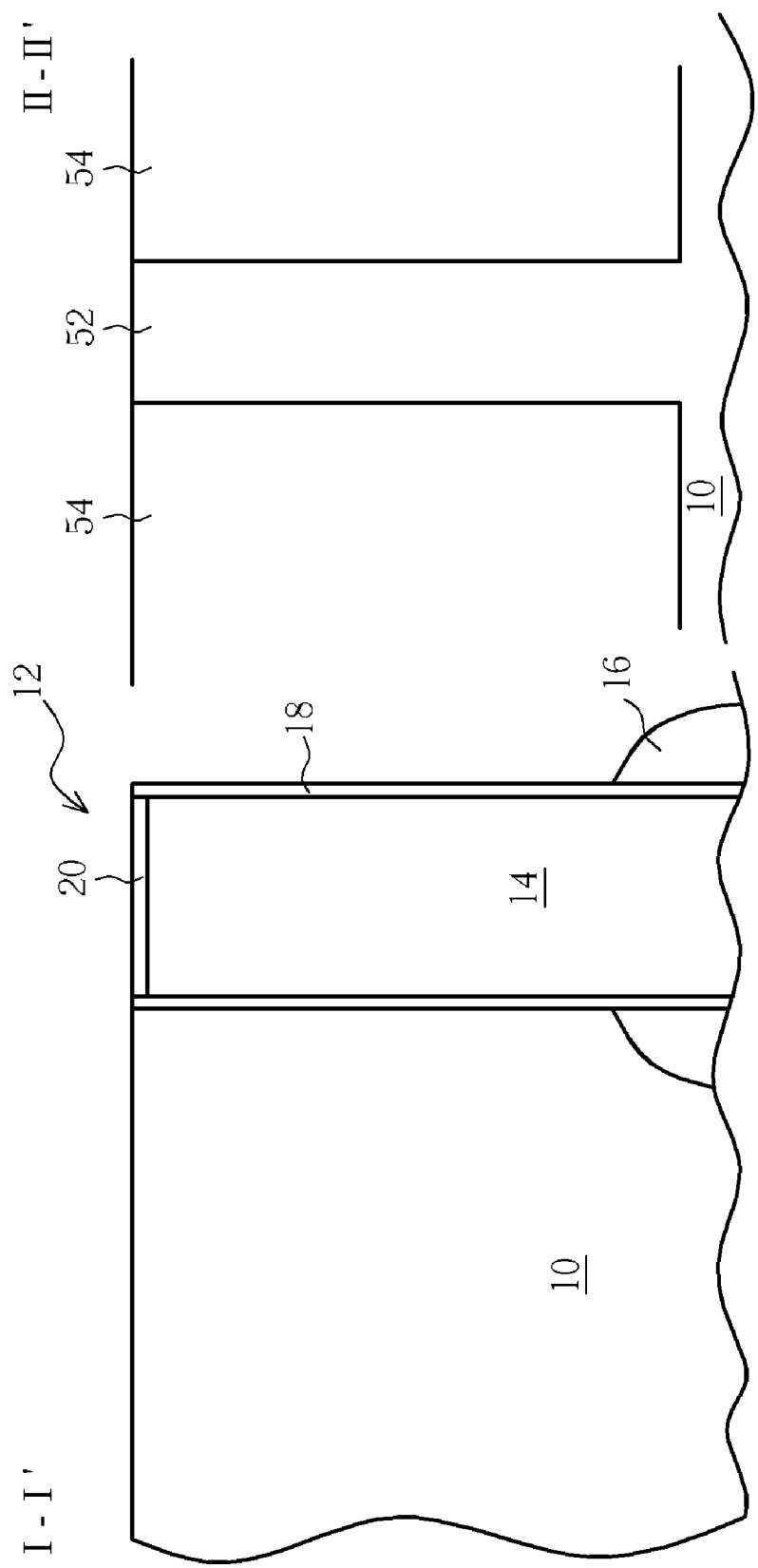
FIG. 13 to FIG. 22 depict a sectional view of making the DRAM structure taken along line I-I' and line II-II' in FIG. 12.

FIG. 13 shows a substrate 10 comprising the active area 52, the STI structure 54 and the trench capacitor 12. The trench capacitor 12 comprises a conductive layer 14, a bottom electrode 16, and a capacitor dielectric layer 18 surrounding the conductive layer 14 in order to isolate the conductive layer 14 and the substrate 10. A oxide layer 20 is formed on the conductive layer 14.

Figure 14:
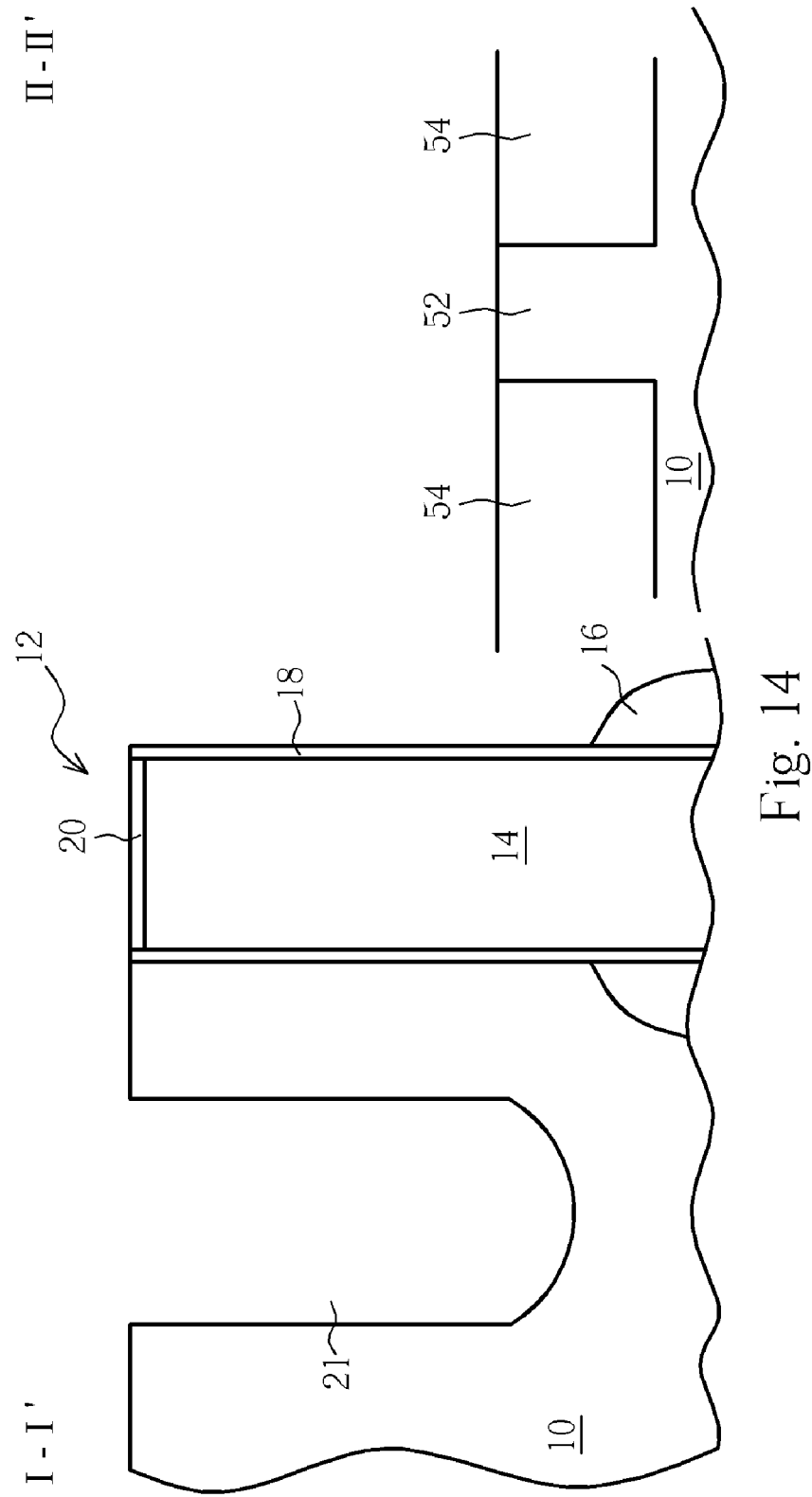

As shown in FIG. 14, a trench 21 on a side of the trench capacitor 12 is formed. The trench 21 passes the active area 52 and the STI structure 54. In addition, the trench 21 is perpendicular to the active area 54 and the STI structure 54 in the horizontal direction, and the depth of the trench 21 is shallower than the STI structure 54.

Figure 15:
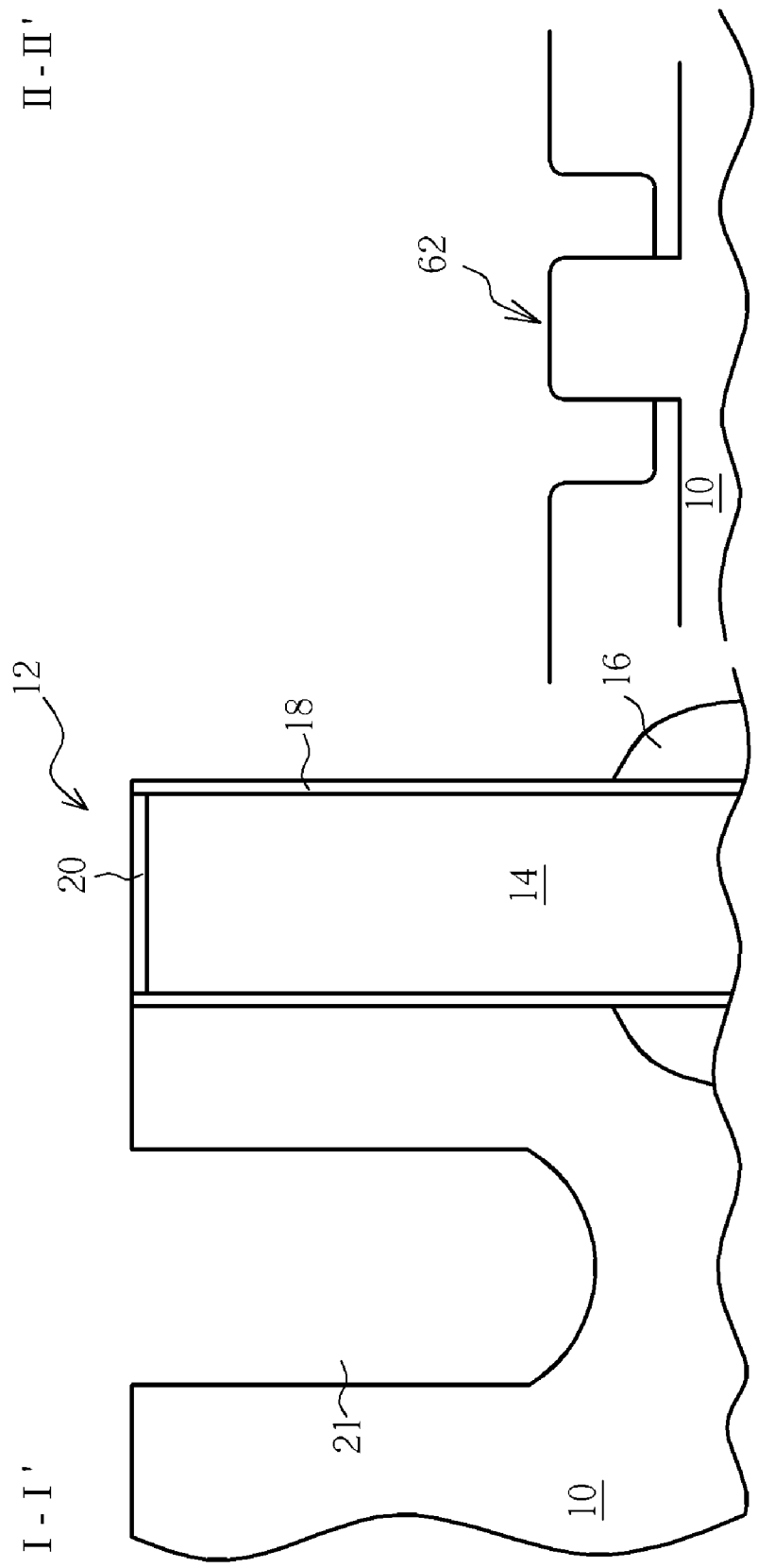
Figure 16:
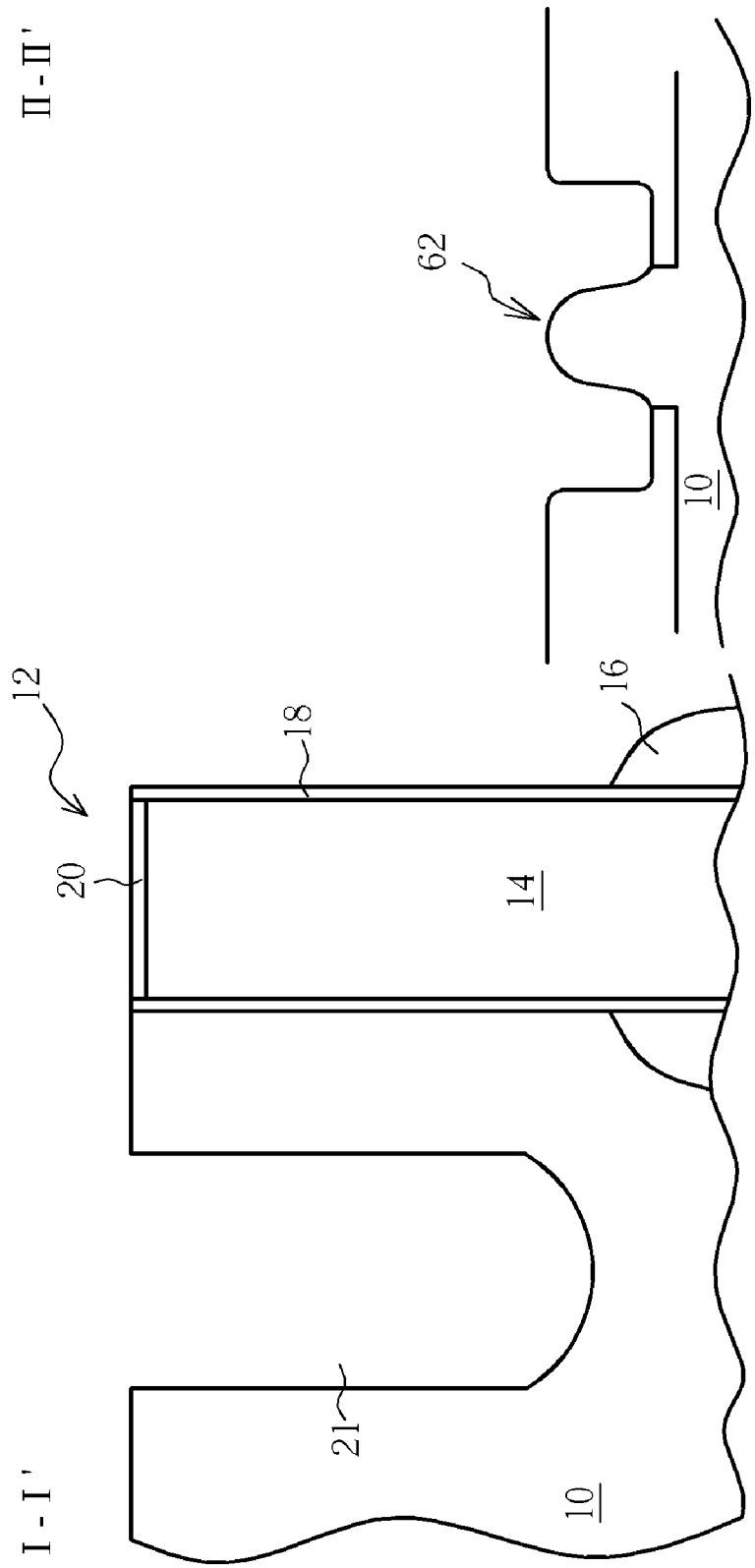

As shown in FIG. 15, an anisotropic etching process is performed on part of the STI structure 54 to form a fin structure 62 having an arcuate portion at the bottom of the trench 21. As shown in FIG. 16 the fin structure 62 is made thinner and rounder by the wet etching process. The wet etching process can be performed by using a mixture of ammonia and hydrofluoric acid.

Figure 17:
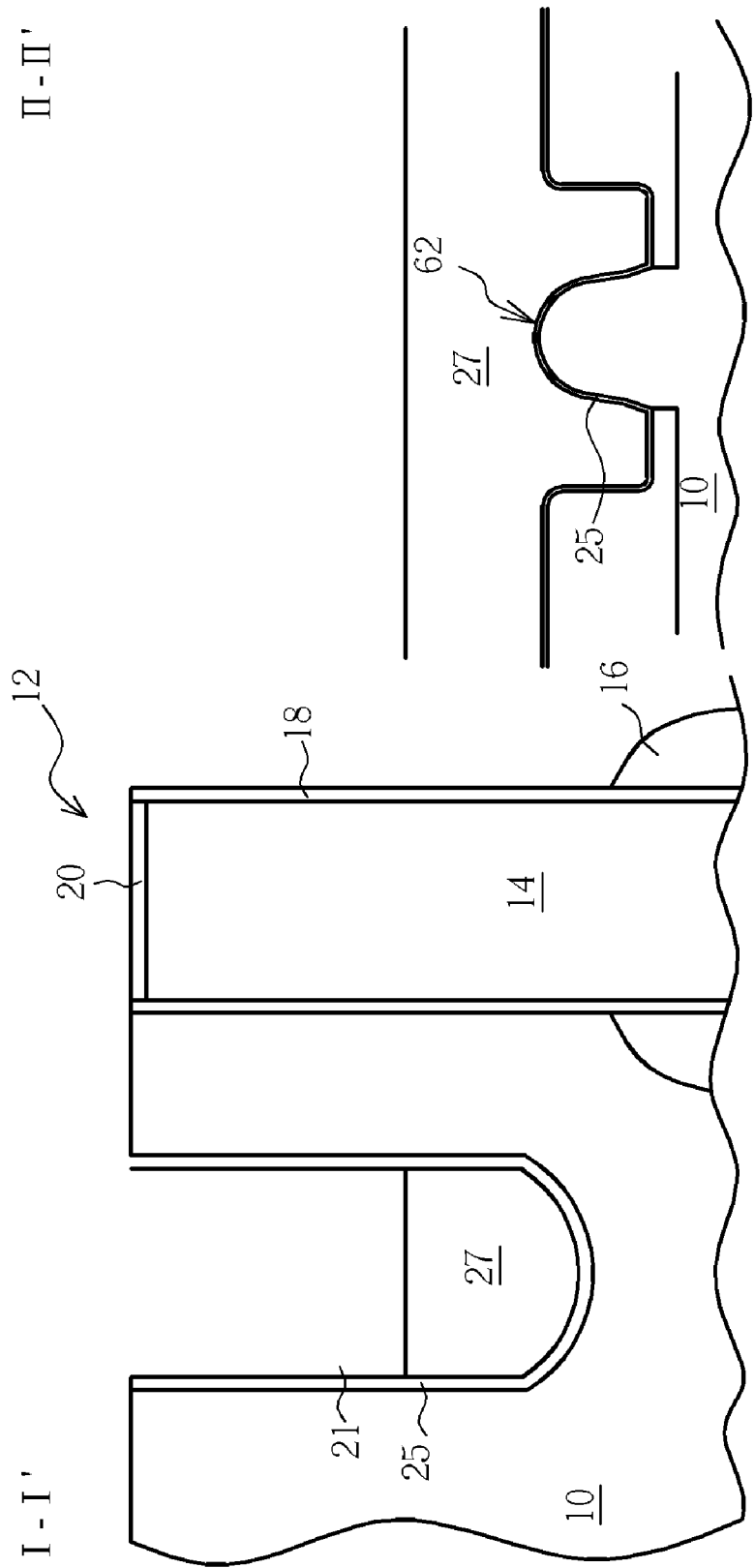

As shown in FIG. 17, a oxide layer 25 is formed on the surface of the trench 21 and the fin structure 62. The oxide layer 25 serves as an insulating layer. Due to the formation of the fin structure 62, the oxide layer 25 has an arcuate portion, a fin structure. A gate matter 27 is formed on the oxide layer 25. Then, the gate matter 27 is etched to a predetermined depth.

Figure 18:
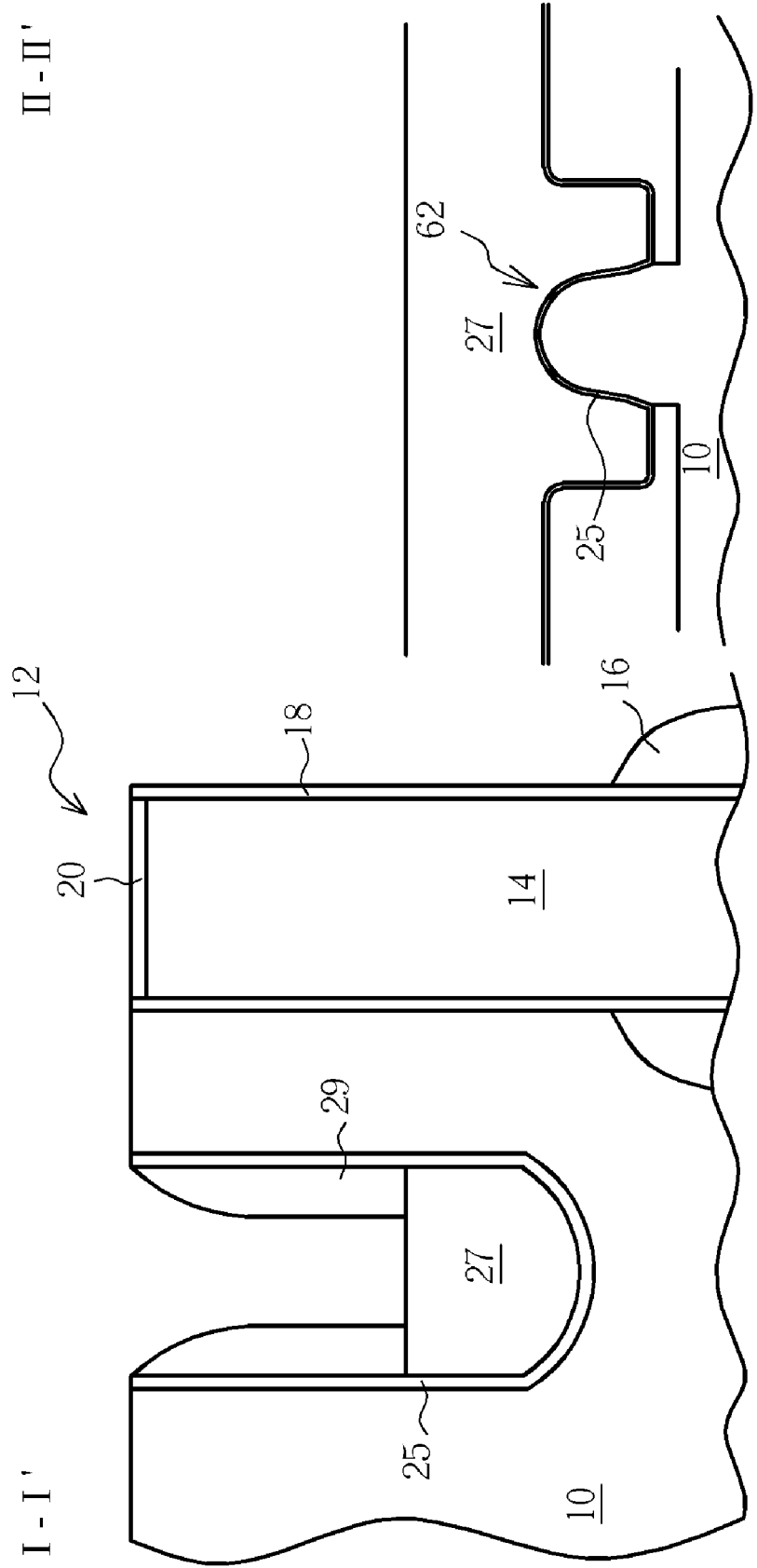

As shown in FIG. 18, an inner spacer 29 is formed on the gate matter 27. The method of forming the inner spacer 29 includes depositing a silicon oxide layer on the inside wall of the trench 21 and on the surface of the gate matter 27, and performing an anisotropic etching on the silicon oxide layer.

Figure 19:
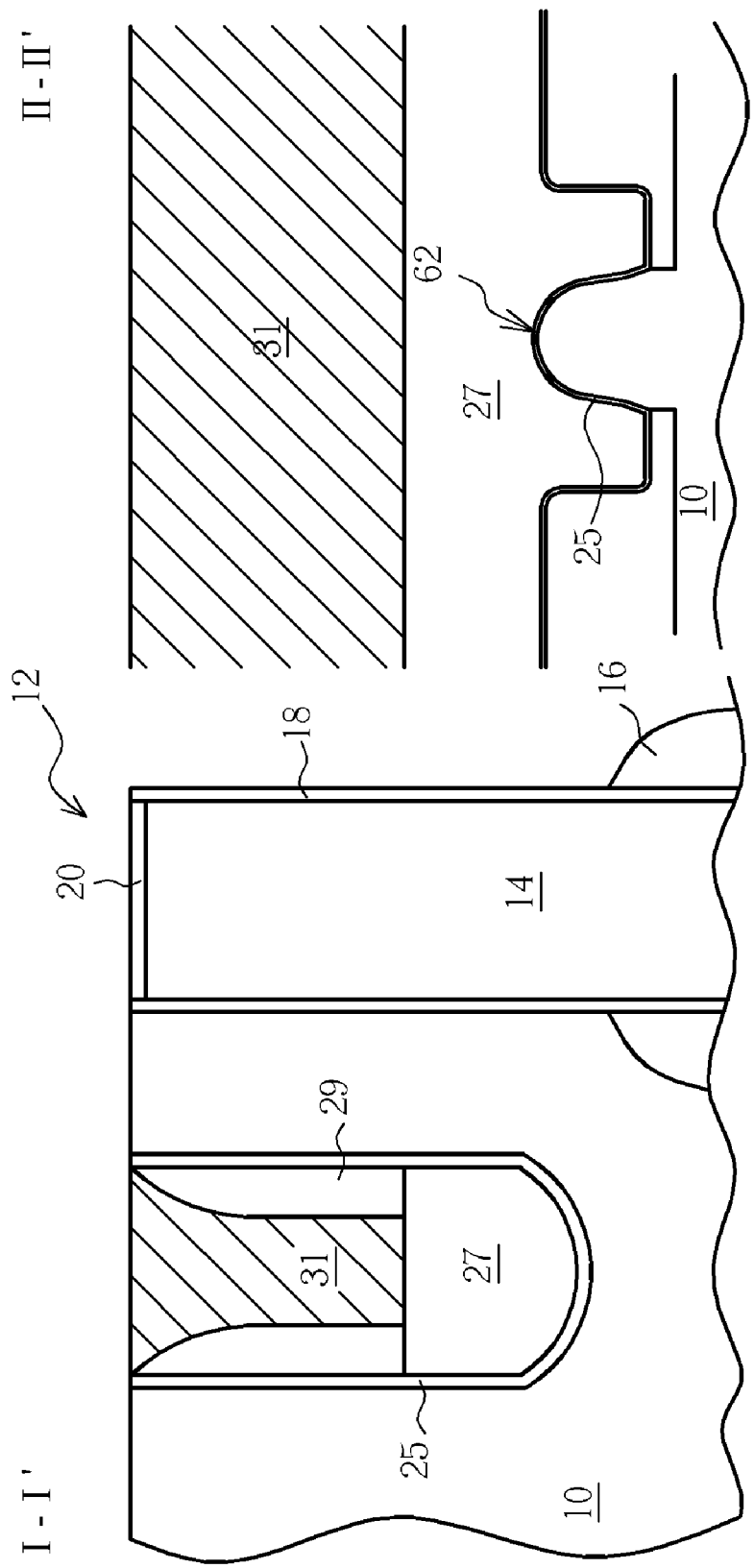

As shown in FIG. 19, a conductor 31 is formed on the gate matter 27 and fills up the trench 21, wherein the conductive layer serves as a buried word line. The conductor 31 comprises W, Ni, silicide, polysilicon or any combination thereof.

Figure 20:
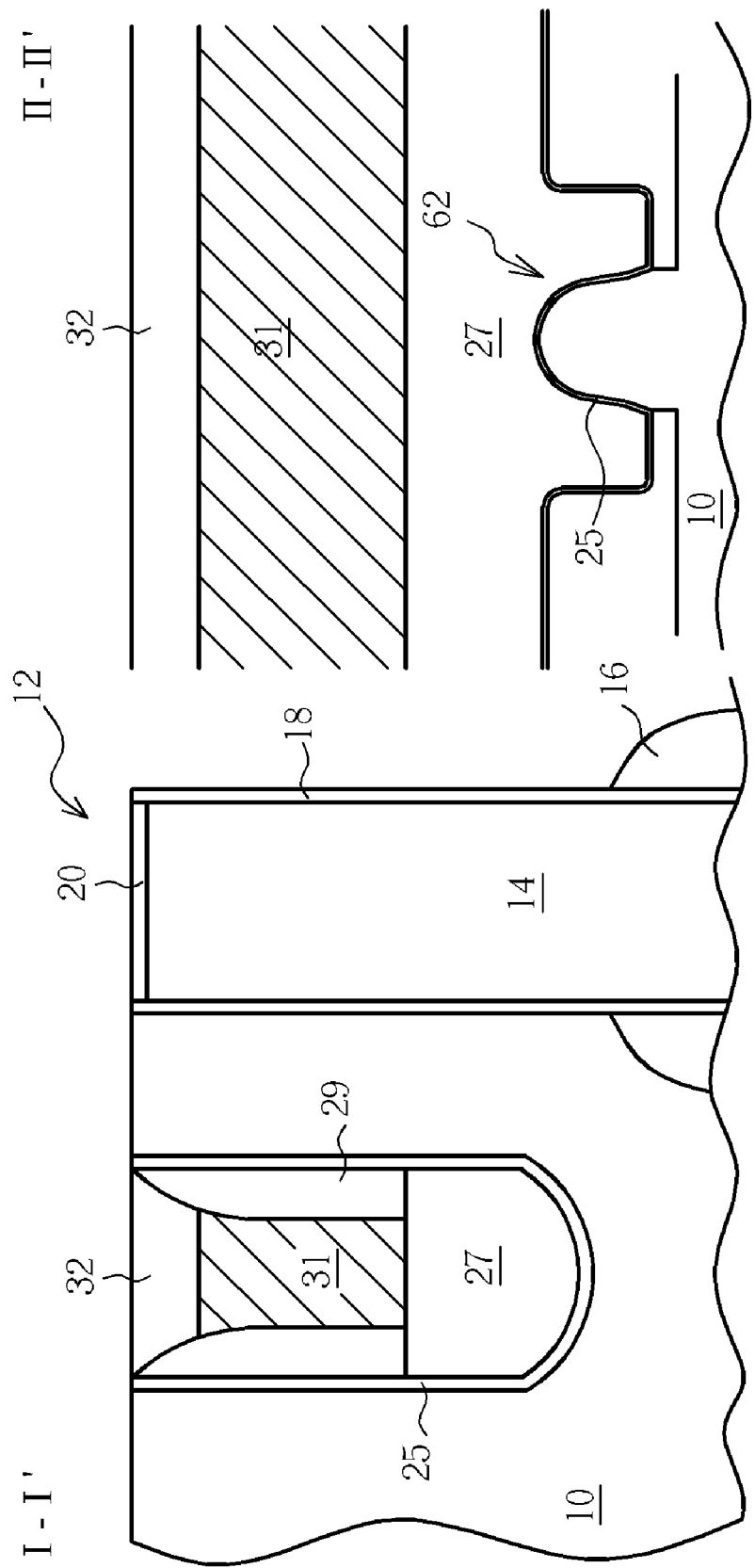

As shown in FIG. 20, a cap layer 32 is formed on the conductor 31. The conductor 30 together with the gate matter 27, the oxide layer 25, the cap layer 32 and the inner spacer 29 function as a buried gate.

Figure 21:
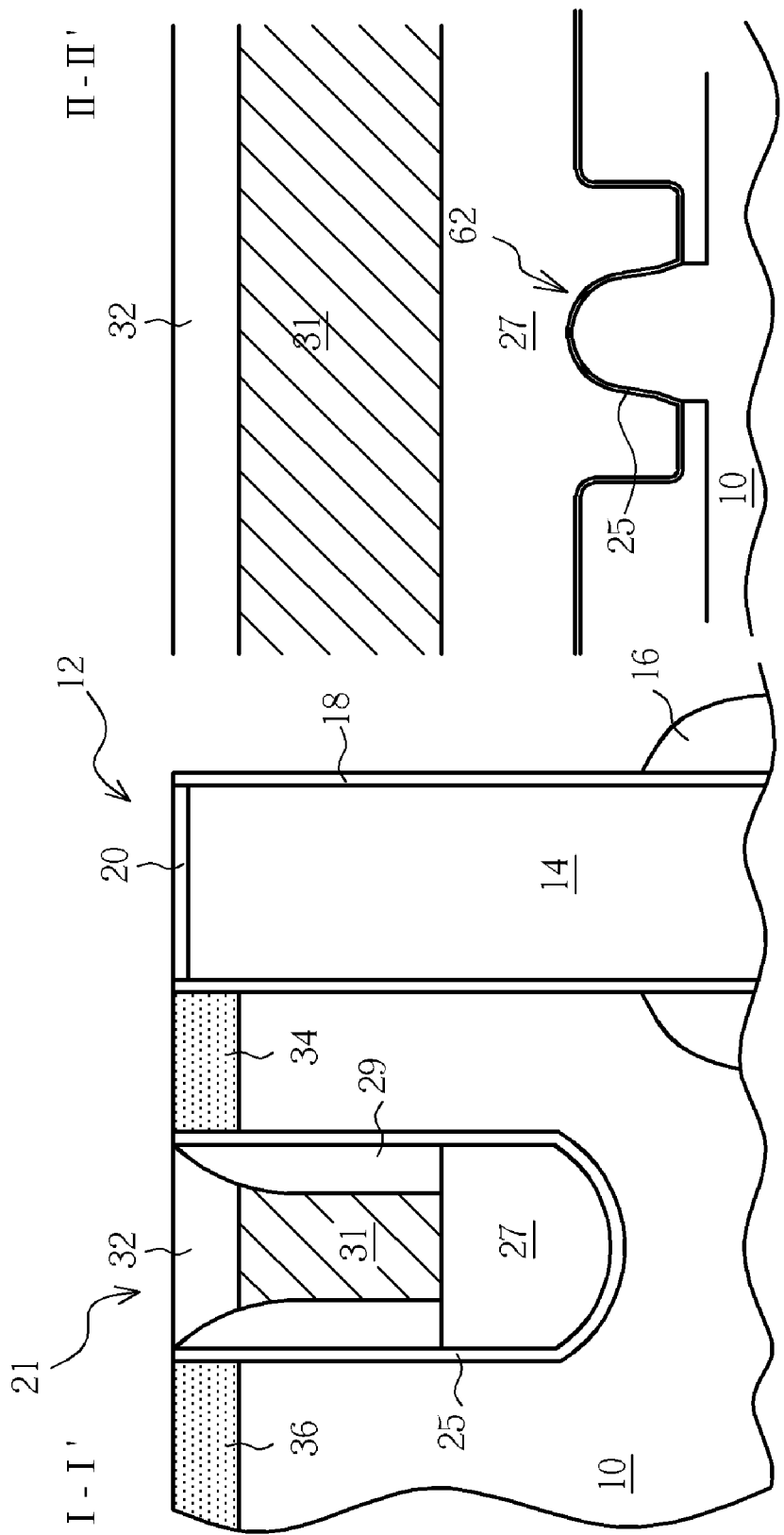

As shown in FIG. 21, a drain doping region 34 is formed in the substrate 10 between the trench 21 and the trench capacitor 12 and a source doping region 36 is formed in the substrate 10 at a side of the trench 21.

Figure 22:
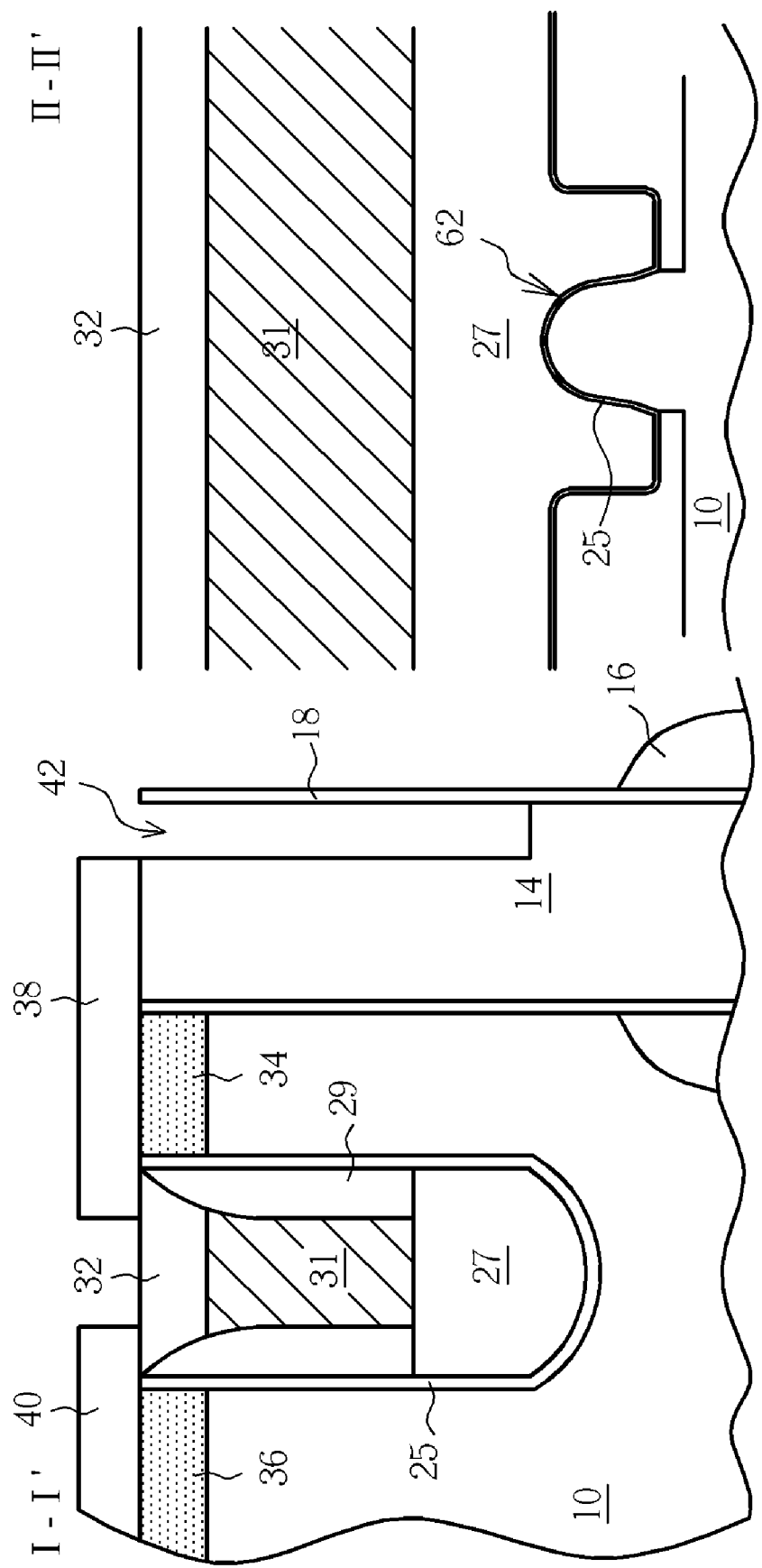

As shown in FIG. 22, the oxide layer 20 is removed. Next, a conducting strap 38 and a contact pad 40 are formed simultaneously, wherein the conducting strap 38 covers the drain doping region 34, the conductive layer 14 and part of the cap layer 32, and wherein the contact pad 40 covers the source doping region 36. The conducting strap 38 can be metal, silicide, non-metal (such as graphite and polysilicon) or any combination thereof. In addition, the method of forming the conducting strap 38 includes chemical vapor deposition (CVD) and plasma enhanced chemical vapor deposition (PECVD). The thickness of the conducting strap is about 3 metal atoms or 500 Å.

Finally, an isolation structure 42 is formed in the trench capacitor 12, wherein the isolation structure 42 can be silicon oxide, silicon nitride or silicon oxide/silicon nitride.

Figure 23:
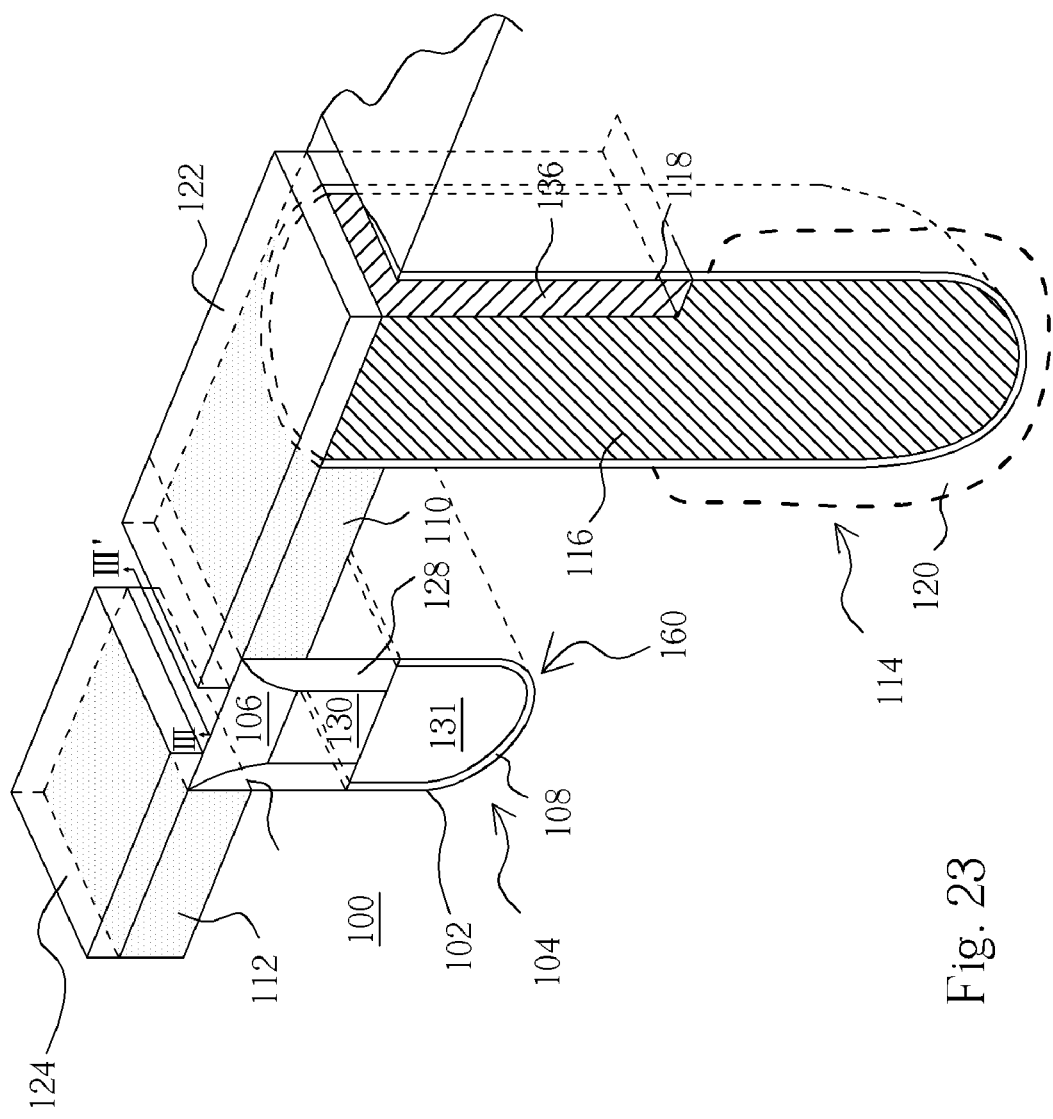
FIG. 23 depicts a three-dimensional DRAM structure according to the first and second embodiments of the present invention.

FIG. 23 shows a three-dimensional DRAM structure according to the first and second embodiments of the present invention. The DRAM structure includes a substrate 100, a trench 102 positioned in the substrate 102, a buried gate 104 comprising a word line 130 positioned in the trench 102, wherein the word line 130, which can be called as a conductor, can be W, Ni, silicide, polysilicon or any combination thereof, a gate matter 131 positioned under the word line 130, a cap layer 106 positioned in the trench 102, wherein the cap layer 106 is covered on the buried gate 104, a oxide layer 108 serving as an insulating layer positioned on the inside wall of the first 102, a inner spacer 128 positioned on the surface of the oxide layer 108.

The DRAM structure further includes a source doping region 112 positioned in the substrate 100 at a side of the trench 102, a drain doping region 110 positioned in the substrate 100 at another side of the trench 102, a gate channel 160 positioned between the source doping region 112 and the drain doping region 110, wherein the shape of the gate channel 160 is U-shaped, a trench capacitor 114 being adjacent to the drain doping region 110, the trench capacitor 114 comprising at least a conductive layer 116, a bottom electrode 120, an STI structure 136 and a capacitor dielectric layer 118 covering the conductive layer 116 to isolate the conductor layer 116 from the substrate 100, a conducting strap 122 comprising metal, silicide, non-metal (such as graphite and polysilicon) protruding from the surface of the substrate 100 to connect the drain doping region 110 and the conductive layer 116 electrically, wherein the conducting strap 122 partly covers the cap layer 106, and a contact pad 124 covering the source doping region 112. In addition, a sectional view taken along line III-III' will be illustrated in FIG. 24 and FIG. 25.

Figure 24:
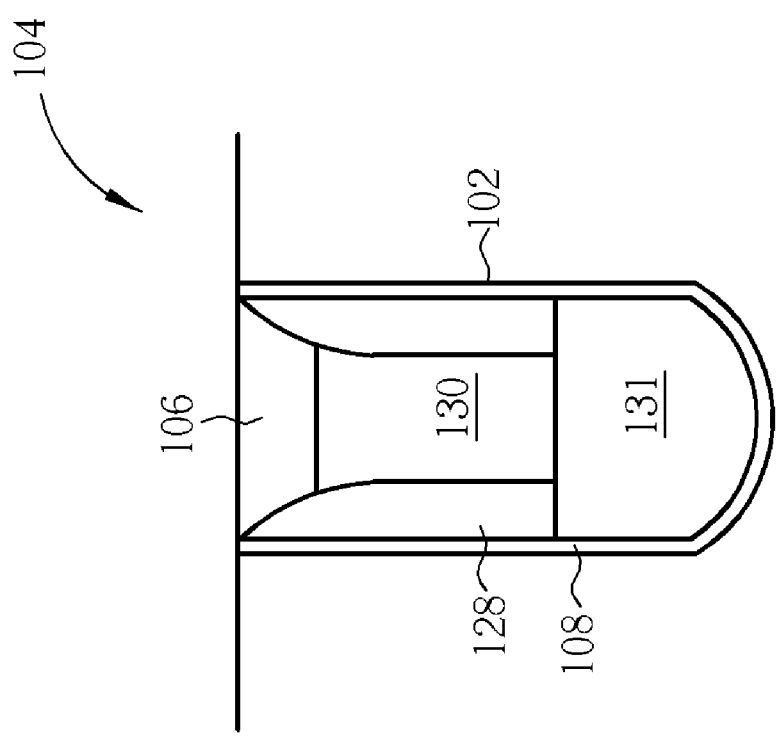
FIG. 24 depicts a sectional view of the DRAM structure of the first embodiment taken along line III-III' of FIG. 23.

FIG. 24 shows a sectional view of the DRAM structure of the first embodiment taken along line III-III' of FIG. 23. As shown in FIG. 24, the buried gate 104 is positioned in the trench 102, wherein the buried gate 104 comprises the word line 130 the gate matter 131, the cap layer 106, the oxide layer 108, and the inner spacer 128.

Figure 25:
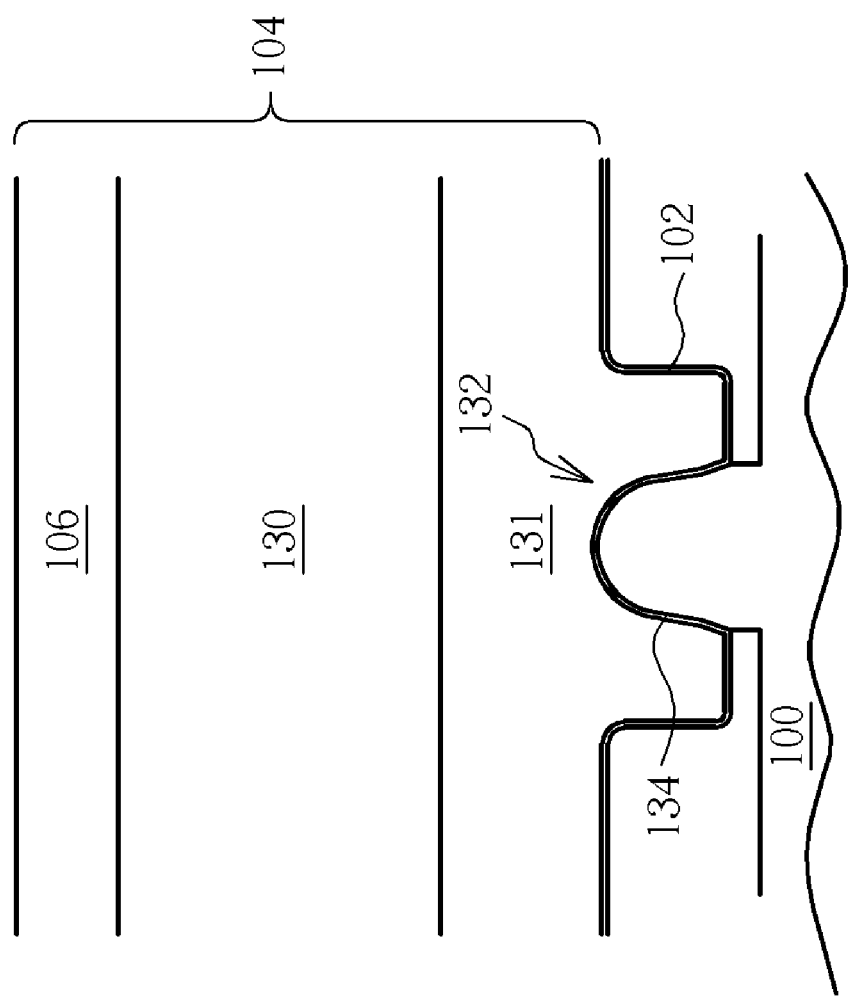
FIG. 25 depicts a sectional view of the DRAM structure of the second embodiment taken along line III-III' of FIG. 23.

FIG. 25 shows a sectional view of the DRAM structure of the second embodiment taken along line III-III' of FIG. 23. As shown in FIG. 25, the buried gate 104 comprises the word line 130, the conductor 131, the cap layer 106, the gate oxide layer 108 (not shown), and the inner spacer 128 (not shown). In addition, the fin structure 132 having an arcuate portion is positioned in the bottom of the trench 102, and the oxide layer 134 serving as an insulating layer covers the surface of the fin structure 132. Due to the formation of the fin structure 132, the oxide layer 134 has an arcuate portion, a fin structure. In this way, the fin structure will become fully depleted during operation, and the DRAM can be controlled more effectively.

Those skilled in the art will readily observe that numerous modifications and alterations of the device and method may be made while retaining the teachings of the invention.

What is claimed is:

1. A memory device comprising:
   a substrate;
   a trench capacitor formed in the substrate, wherein the trench capacitor has a top surface being coplanar with a top surface of the substrate;
   a buried gate formed in the substrate, wherein the buried gate has a top surface being coplanar with the top surface of the substrate;
   a drain region formed between the trench capacitor and the buried gate in the substrate; and
   a conducting strap formed on a portion of the top surface of the substrate to electrically connect the trench capacitor to the drain region;
   wherein the buried gate comprises:
   an insulating layer formed in a bottom surface of the buried gate;
   a gate matter formed on the insulating layer;
   a conductor formed on the gate matter;
   an inner spacer formed on the gate matter and between the conductor and the substrate; and
   a cap layer covered the conductor and the inner spacer.

2. The memory device of claim 1, wherein a material of the conductor is selected from a group consisting of tungsten, nickel, copper, silicide and polysilicon.

3. The memory device of claim 1, wherein the insulating layer has a fin structure.

4. The memory device of claim 1, wherein a material of the conducting strap is selected from a group consisting of metal, silicide, graphite and polysilicon.

5. The memory device of claim 4 further comprising:
   a source region formed in the substrate and on an opposite site to the drain region of the buried gate; and
   a contact pad formed on a portion of the top surface of the substrate and being electrically insulated to the conducting strap, wherein the contact pad directly contacts to the source region.

6. The memory device of claim 5, wherein a material of the contact pad is the same as the conducting strap.

* * * * *